(12) United States Patent
Lim et al.

(10) Patent No.: US 6,905,570 B2
(45) Date of Patent: Jun. 14, 2005

(54) APPARATUS FOR MANUFACTURING INTEGRATED CIRCUIT DEVICE

(75) Inventors: Kwang-Shin Lim, Gyeonggi-do (KR); Pil-Kwon Jun, Gyeonggi-do (KR); Hun-Jung Yi, Gyeonggi-do (KR); Sang-Oh Park, Gyeonggi-do (KR); Yong-Kyun Ko, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/627,565

(22) Filed: Jul. 24, 2003

(65) Prior Publication Data

US 2004/0022607 A1 Feb. 5, 2004

(30) Foreign Application Priority Data

Aug. 5, 2002 (KR) ................................. 10-2002-0046060

(51) Int. Cl.⁷ ............................ B08B 7/02; H01L 21/22
(52) U.S. Cl. .................................... 156/345.11; 134/1.3
(58) Field of Search ........................... 134/1.3, 10, 61, 134/56 R, 113; 118/500; 156/345.11

(56) References Cited

U.S. PATENT DOCUMENTS

| | | | | |
|---|---|---|---|---|
| 4,256,229 A | * | 3/1981 | Lee | 211/41.18 |
| 5,370,142 A | * | 12/1994 | Nishi et al. | 134/61 |
| 5,698,038 A | * | 12/1997 | Guldi et al. | 134/1 |
| 5,698,040 A | * | 12/1997 | Guldi et al. | 134/1.3 |
| 5,704,494 A | * | 1/1998 | Nishikiori et al. | 211/41.12 |
| 5,845,660 A | * | 12/1998 | Shindo et al. | 134/56 R |
| 6,616,774 B2 | * | 9/2003 | Sonoda et al. | 134/32 |

FOREIGN PATENT DOCUMENTS

| | | | |
|---|---|---|---|
| JP | 62290125 A | * 12/1987 | ........... H01L/21/22 |
| KR | 10-1998-0012079 | 11/1999 | |
| KR | 20-1998-0012729 | 2/2000 | |
| KR | 10-1999-0020262 | 1/2001 | |

OTHER PUBLICATIONS

English Language Abstract of Korean Publication No.: 20–1998–0012729.
English Language Abstract of Korean Publication No. 10–1998–0012079.
English Language Abstract of Korean Publication No. 10–1999–0020262.

* cited by examiner

*Primary Examiner*—Gregory Mills
*Assistant Examiner*—Sylvia R. MacArthur
(74) *Attorney, Agent, or Firm*—Marger Johnson & McCollom, P.C.

(57) ABSTRACT

An apparatus includes a chamber for containing a fluid, a guide seated in the chamber, and a transfer robot for loading and/or unloading a plurality of wafers to and/or from the guide. The wafers are located on the guide. The guide has a supporting member for supporting a wafer and a stopper member for preventing the wafer from being inclined over a predetermined range. The stopper member is in contact with a wafer edge disposed at a higher position than a wafer edge supported by the supporting member. A wafer guide has a stopper member to prevent adjacent wafers from being inclined and coming in contact with each other. Therefore, it is possible to suppress a poor drying such as water spots (or watermarks) produced when wafers are adhered to each other in a drying process.

19 Claims, 13 Drawing Sheets

APPARATUS FOR MANUFACTURING INTEGRATED CIRCUIT DEVICE

This application claims priority from Korean Patent Application No. 2002-46060, filed on Aug. 5, 2002, the contents of which are incorporated herein by reference in their entirety.

BACKGROUND OF THE INVENTION

1. Field of the Invention

The present invention generally relates to an apparatus for manufacturing a semiconductor device. More specifically, the present invention is directed to an apparatus for manufacturing an integrated circuit device that includes a wafer guide for holding wafers and a transfer robot for loading wafers onto the wafer guide.

2. Description of the Related Art

A wafer cleaning process is necessary to remove residual chemicals, small particles, and contaminants that are produced during the manufacture of integrated circuits. In particular, a cleaning process for removing fine contaminants attached to a wafer is very significant when highly-integrated circuits are fabricated.

The wafer cleaning process includes a chemical cleaning process for removing contaminant particles remaining on wafers, such as copper, or native oxide. This can be accomplished by using electrolysis ionized water or hydrofluoric acid, a rinsing process for cleaning chemical-treated wafers with de-ionized wafer (DI water), and a drying process for drying rinsed wafers. Since static electricity, water spots (watermarks), and linear particles exert a great adverse effect on the subsequent cleaning processes, the drying process is more important.

Typically, a rinsing process can include the steps of (1) supplying DI water from the bottom of a bath to remove chemicals remaining on a wafer, and (2) overflowing the DI water. The drying process can include the steps of (1) spraying isopropyl alcohol (IPA) vapor having a lower tension than the DI water onto a wafer so as to apply the Marangoni effect, and (2) slowly draining the DI water through a pipe disposed at the bottom of the bath.

A conventional wafer guide is now described with reference to FIG. 1. Referring to FIG. 1, a wafer 10 is placed on a guide seated in a processing chamber. A typical cleaning apparatus defines a chamber into which a fluid is supplied and includes a guide for holding wafers. The guide has supporting rods which include a plurality of slots, which enable a plurality of wafers to be processed en masse. In recent years, a half pitch has been employed to shorten the slot-to-slot pitch of the guides from 10 mm to 5 mm.

As a result, 50 wafers can be processed in a bath previously sized for processing 25 wafers. To achieve further enhanced productivity and cost saving, wafers of a 300 mm size are substituted for wafers of a 200 mm size. But this results in the following problems described with reference to FIG. 2A and FIG. 2B.

Referring to FIG. 2A and FIG. 2B, wafers 10 are loaded on slots of a guide in a substantially vertical disposition by a transfer robot. While DI water supplied from the bottom of a bath 110 overflows the wafers 10 in a rinsing process, and the DI water is slowly drained in a drying process, the wafers 10 are vibrated and are moved to an inclined position. Even when a wafer of a 200 mm size is maximally inclined, it does not come in contact with another adjacent wafer of a 200 mm size due to the fact that there is sufficient spacing therebetween. But when a wafer of a 300 mm size is inclined at the same angle as the wafer of a 200 mm size, it will come into contact with another adjacent 300 mm sized wafer(see FIG. 2B).

If a wafer is treated with hydrofluoric acid (HF), the surface of the wafer becomes hydrophobic. Therefore, wafers are tightly adhered to each other. At adhered portions of the wafers, DI water is incompletely dried. This causes water spots and unwanted particles remain on the wafer surface.

SUMMARY OF THE INVENTION

In one embodiment, an apparatus for manufacturing an integrated circuit device includes a chamber filled with a fluid and a guide seated in the chamber. A plurality of wafers are placed on the guide. The guide has at least one supporting member for supporting the wafers and a stopper member for preventing wafers supported by the supporting member from being inclined and coming in contact with adjacent wafers.

Preferably, the guide includes a first supporting member having Y-shaped section slots into which bottom edges of the wafers are respectively inserted, a second supporting member having V-shaped section slots into which edges disposed below a middle edge of the respective wafers in one side of the first supporting member are respectively inserted; and a third supporting member having V-shaped section slots into which edges of the wafers are respectively inserted. The third supporting member is disposed at a position corresponding to the second supporting member from the first supporting member.

The stopper member has V-shaped section slots that are in contact with an edge been at a higher position than the edge of the respective wafers supported by the supporting members.

The apparatus further includes a transfer robot for loading/unloading the wafer to/from the guide. The transfer robot has a first arm for supporting one edge of the respective wafers and a second arm for supporting the other side edge of the respective wafer. In this case, the second arm is shorter than the first arm.

In another embodiment, the apparatus further includes a transfer robot for loading/unloading the wafers to/from the guide. The transfer robot includes a first arm for supporting one side edge of the respective wafers and a second arm which is in contact with the other side edge located at a higher position than edges of the wafer which is in contact with the first arm.

The first arm has first and second slots into which the wafers are inserted, thereby supporting the respective wafers at two points. The lower slot supports a position between an edge of the wafer being in contact with the second supporting member and a middle edge thereof.

The second arm includes a load portion that has a first contact edge and a second contact edge to move the wafers in contact with the wafers. The first contact edge is in contact with the wafers between the wafer edge contacted with the stopper member and the wafer edge that is point-symmetrical with a contact position of the lower slot and the wafers with respect to a center of the wafer.

Preferably, the first and second contact edges are interconnected by a body portion. The body portion is rotated within the range of a predetermined angle together with the first and second contact edges.

The second arm further has side portions connected to both sides of the load portion. Guide grooves for guiding the rotation of the body portion are formed at the inside of the side portion.

DETAILED DESCRIPTION OF THE PREFERRED EMBODIMENTS

Figure 1:
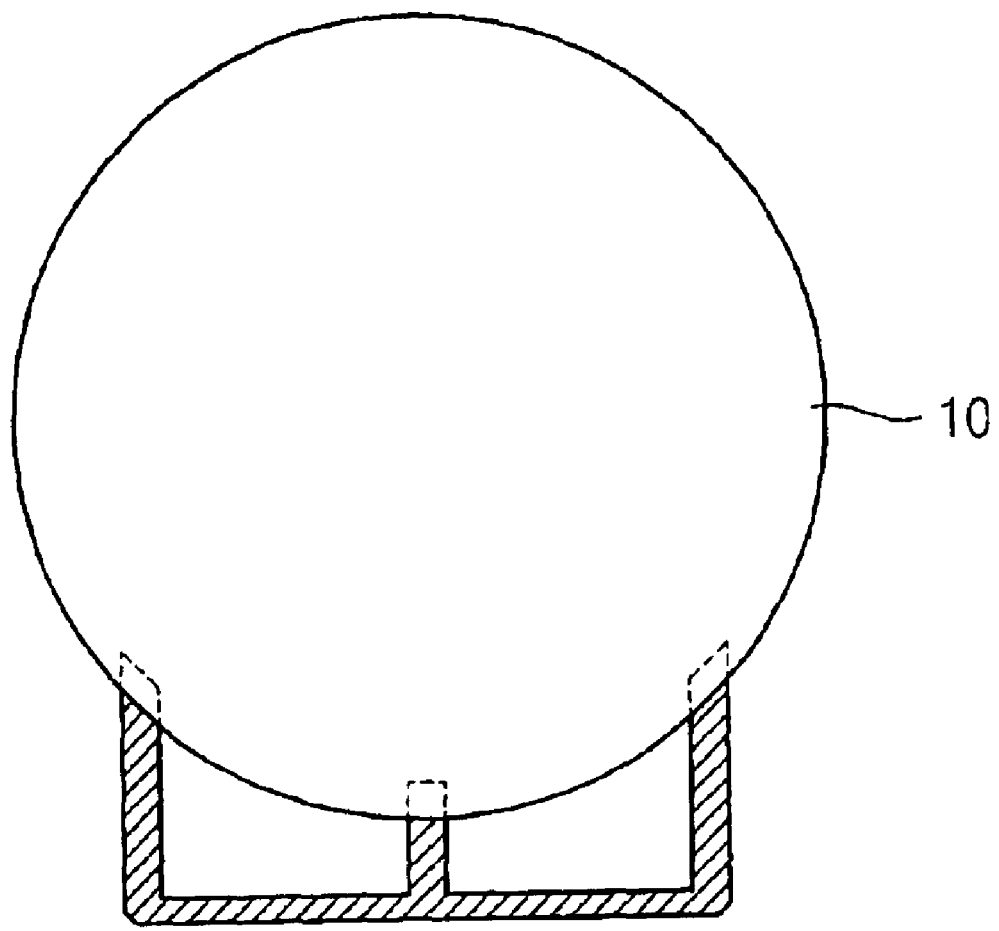
FIG. 1 is a front cross-sectional view of a typical prior art wafer guide for use in a cleaning apparatus.
Figure 2A:
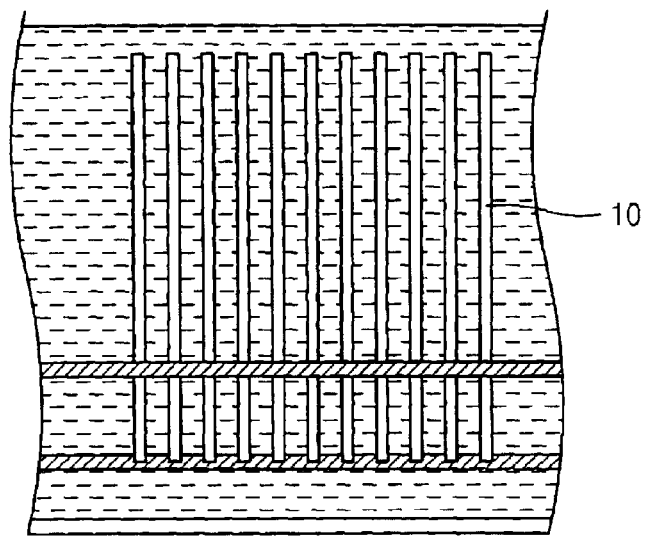
FIG. 2A is a cross-sectional view of wafers held by the prior art wafer guide shown in FIG. 1.
Figure 2B:
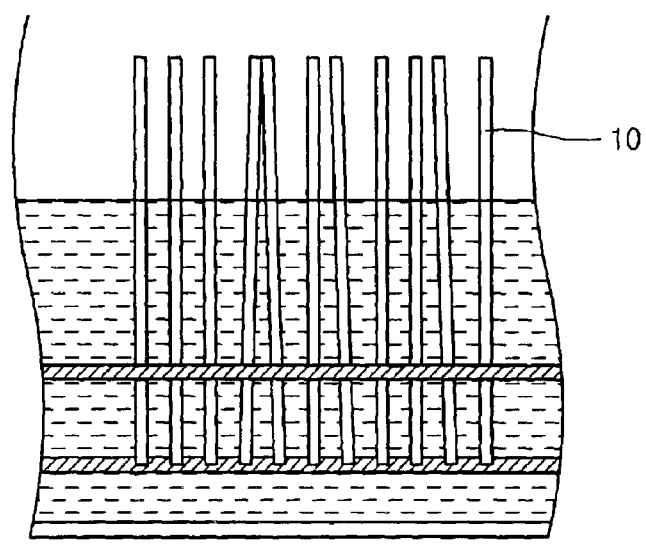
FIG. 2B is a cross-sectional view showing a wafer that is inclined on a prior art wafer guide and is in contact with another adjacent wafer.
Figure 3:
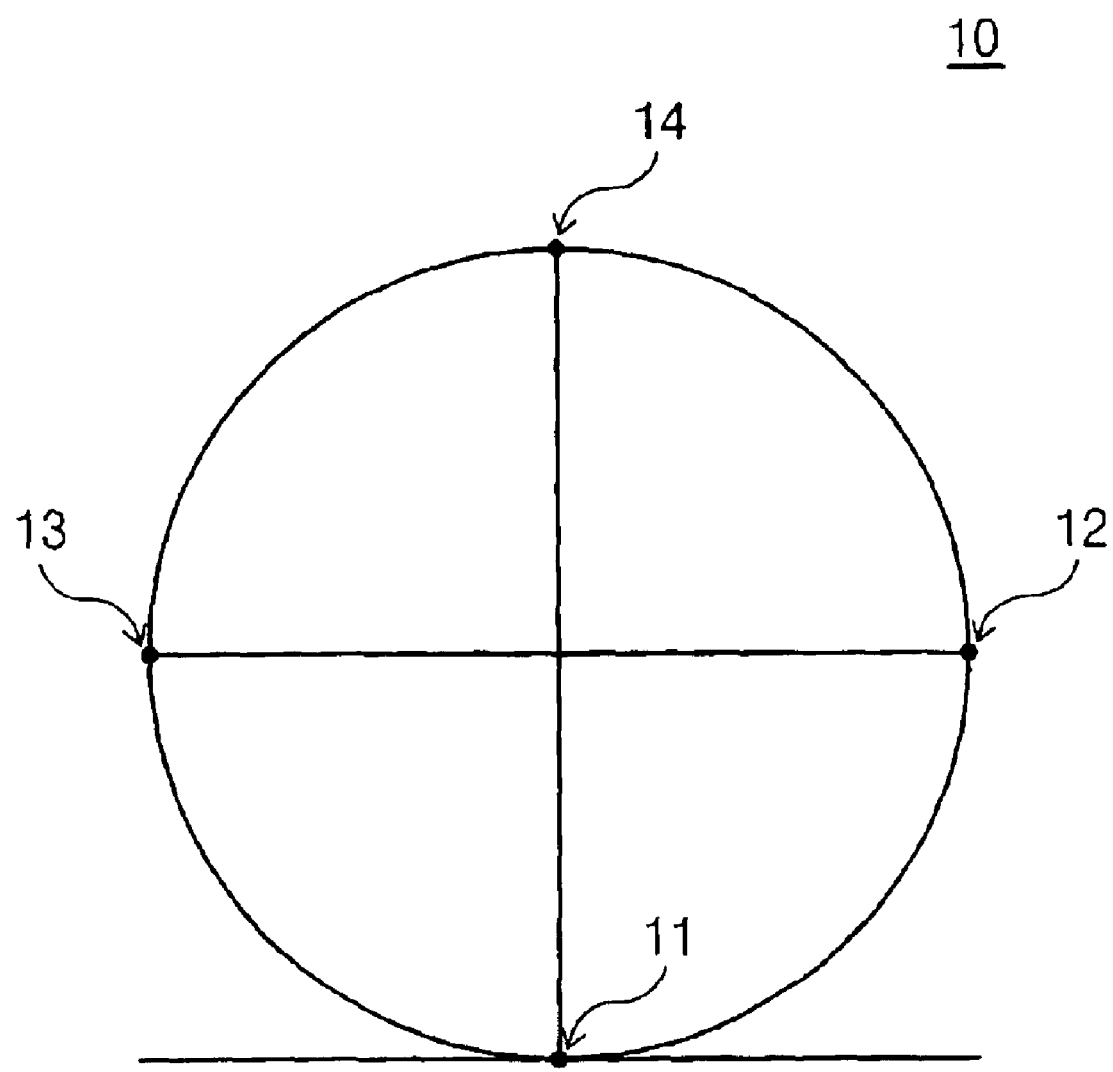
FIG. 3 is a diagram for defining portions of a wafer used in an embodiment of the present invention.

Referring to FIG. 3, portions of a wafer 10, shown in an upright position, are defined. A portion of the wafer 10 in the bottom thereof is defined as a wafer bottom portion 11. Both ends of a wafer diameter that is perpendicular to a diameter running through the wafer bottom portion 11, are shown as first and second middle portions 12 and 13, respectively. When the wafer bottom portion 11 is symmetrical with respective to a center of the wafer 10, the opposed portion is defined as a wafer top portion 14. Namely, the wafer bottom portion 11 and the wafer top portion 14 are symmetrical with respect to the center of the wafer 10.

Figure 4:
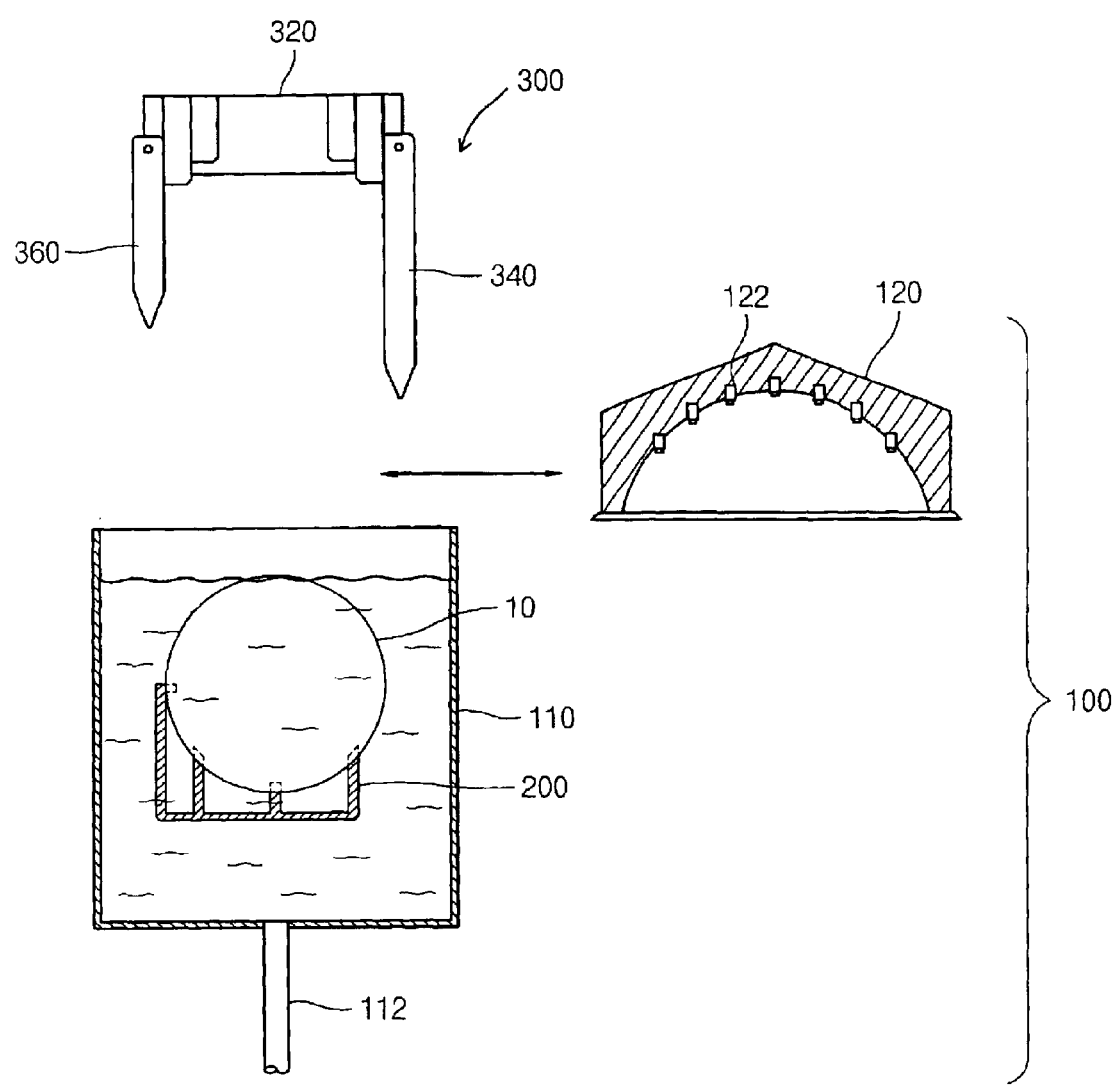
FIG. 4 is an exploded cross-sectional view of a cleaning apparatus according to the present invention.

Referring to FIG. 4, a cleaning apparatus includes a process chamber 100 in which a cleaning process is carried out, a wafer guide 200 seated in the process chamber 100, and a transfer robot 300 for loading and/or unloading a plurality of wafers 10 on and/or from the wafer guide 200.

The process chamber 100 has a bath 110 filled up with a fluid and a lid 120 for covering the bath 110. A plurality of nozzles 122 for spraying, for example, isopropyl alcohol (IPA) and nitrogen gas are provided in the lid 120. A supply hole (not shown) for supplying a liquid such as de-ionized wafer (DI water) is provided to the bath 110. A pipe 112 for draining the liquid is made at a bottom of the bath 110.

Figure 5:
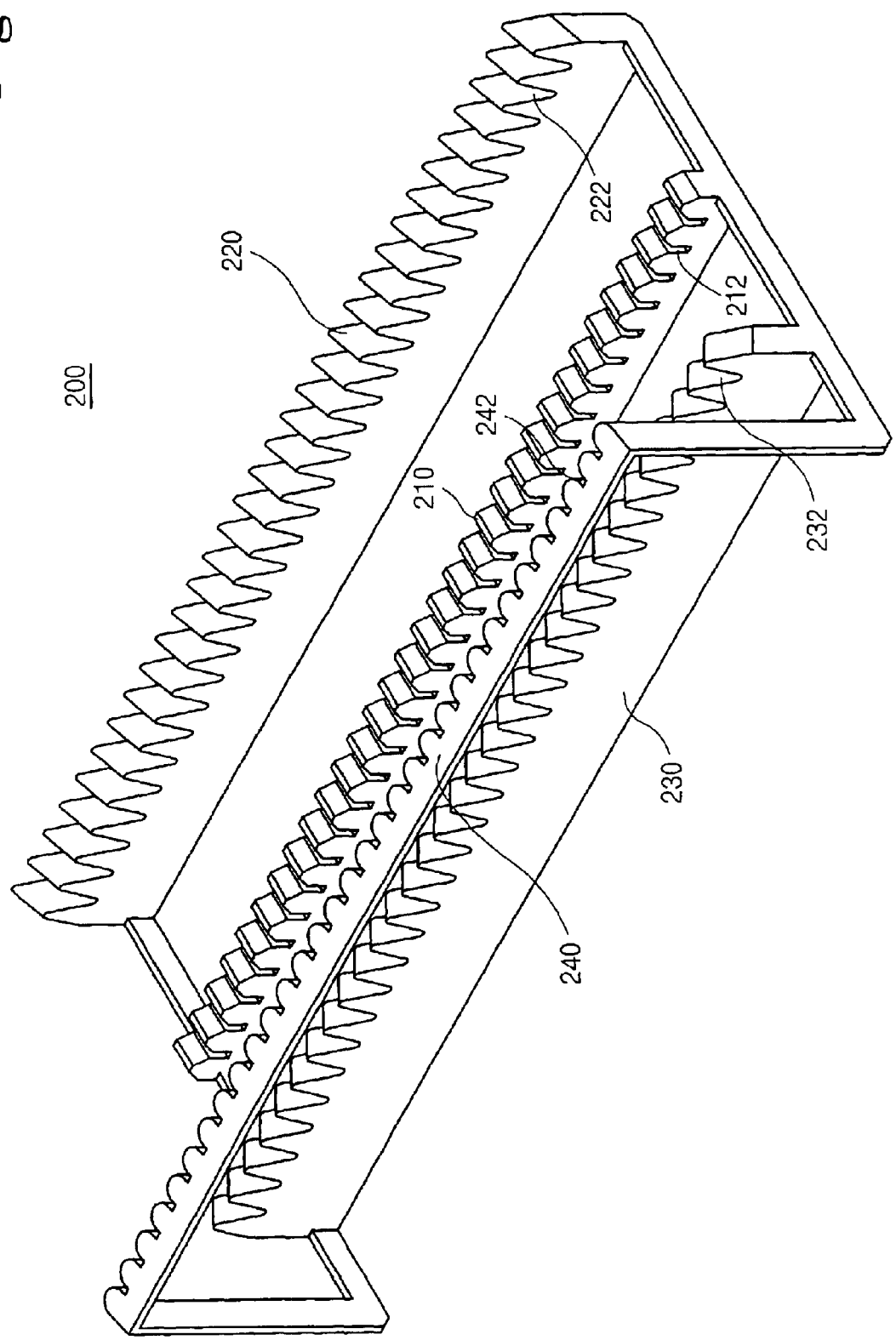
FIG. 5 is a perspective view of a wafer guide according to the present invention.
Figure 6:
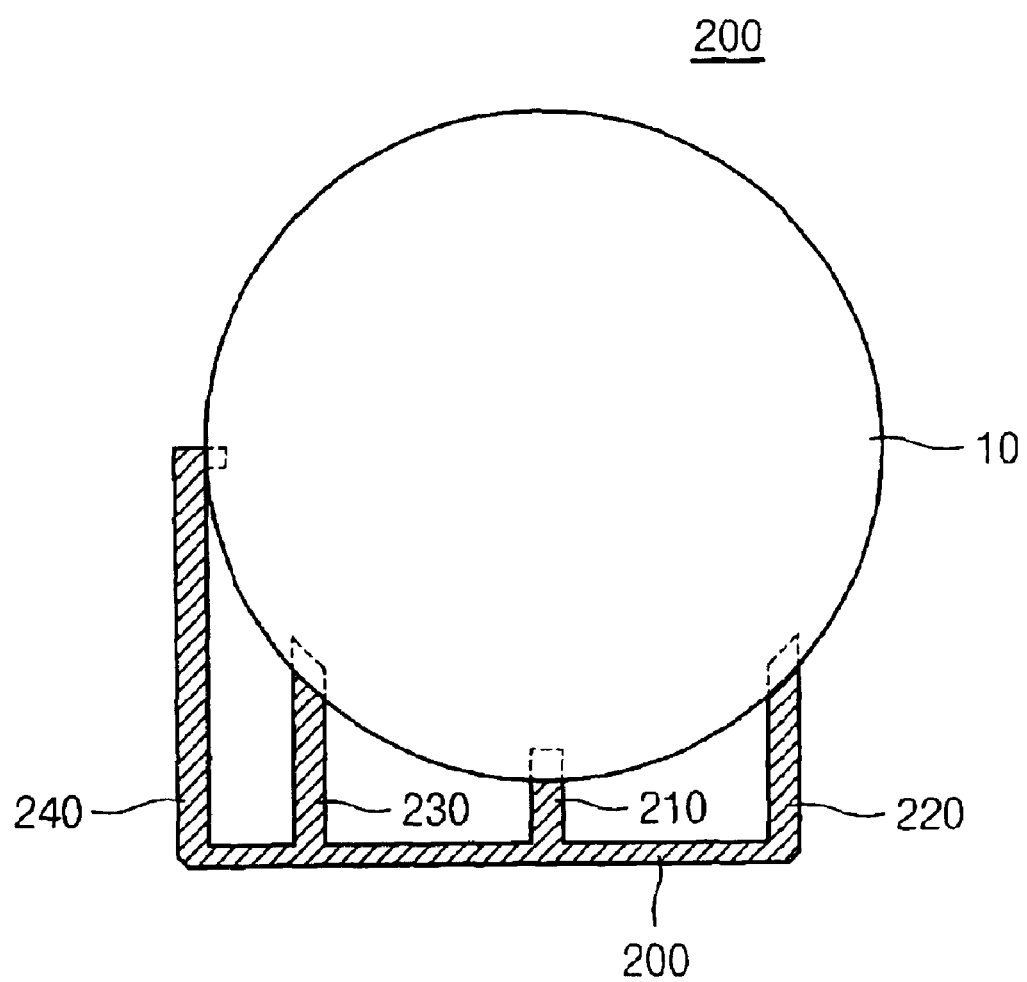
FIG. 6 is a front cross-sectional view of the wafer guide shown in FIG. 5.

Referring to FIG. 5 and FIG. 6, the wafer guide 200 for holding the wafers 10 includes a first supporting member 210, a second supporting member 220, a third supporting member 230, and a stopper member 240.

The first supporting member 210 has a plurality of slots 212 into which wafer bottom portions 11 (see FIG. 3) are respectively inserted.

Figure 7:
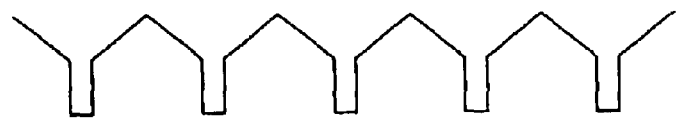
FIG. 7 is a cross-sectional view of slots formed at a first supporting member of the wafer guide shown in FIG. 5.

Referring to FIG. 7, each of the slots 212 tapers downwardly from its entrance to a predetermined position and has a constant width below the predetermined position, i.e., has a Y-shaped section. To stably insert the wafer 10 and prevent its damage, the portion having the constant width ("clearance in the Y-shaped groove") is wider than the thickness of the wafer 10.

Returning to FIG. 6, the second supporting member 220 supports an edge between the wafer bottom portion (11 of FIG. 3) and a first wafer middle portion (12 of FIG. 3). The second supporting member 220 has a plurality of slots 222 (FIG. 5) into which the wafers 10 are respectively inserted. The section of the respective slots 222 formed in the second supporting member 220 is different from that of the respective slots formed in the first supporting member 210.

Figure 8A:
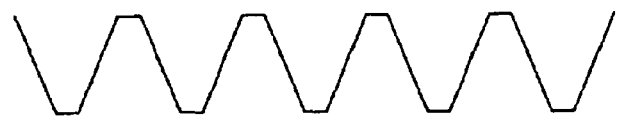
FIG. 8A and FIG. 8B are cross-sectional views of slots formed at second and third members of the wafer guide shown in FIG. 5.
Figure 8B:

Referring to FIG. 8A and FIG. 8B, each of the slots 222 depicted tapers downwardly and inwardly to form a substantially V-shaped configuration. The lower end of the slots 222 can be either pointed or flattened in design.

According to FIG. 5, the third supporting member 230 and the second supporting member 220 are symmetrical with respect to the first supporting member 210. The third supporting member 230 has a plurality of slots 232. An edge between the wafer bottom portion 11 and the second wafer middle portion 13 is inserted into the respective slots 232 of the third supporting member 230. Preferably, the slot 232 of the third supporting member 230 has the same section as the slot 222 of the second supporting member 220. The first and second supporting members 210 and 220 as well as the first and third supporting members 210 and 230 are spaced apart from each other so that a liquid such as DI water can smoothly flow therebetween. The third supporting member 230 plays a role in supporting the wafers 10 in a stable manner, and may not be provided in every case.

In some embodiments, more supporting members may be provided and positions of edges supported by supporting members may be varied.

As previously stated, since the clearance in the Y-shaped groove of the respective slots 212 is wider than a thickness of a wafer, the wafers 10 held by the wafer guide 200 are vibrated and inclined when the DI water level rises or falls. In a severe case, adjacent wafers 10 come in contact with each other, so that they are incompletely dried.

To deal with this problem, the wafer guide 200 has the stopper member 240 to prevent inclination of the wafers 10. The stopper member 240 has slots 242 into which edges of the wafers 10 are respectively inserted. The stopper member 240 is in contact with a wafer edge and is positioned to be higher than the edge of the wafer 10 inserted into the second supporting members 220 and 230.

When a wafer 10 is in contact with the stopper member 240, maximally inclined distances of the wafer 10 are varied depending on edge heights of the wafer 10. The varied distances are now described below with reference to FIG. 9.

Figure 9:
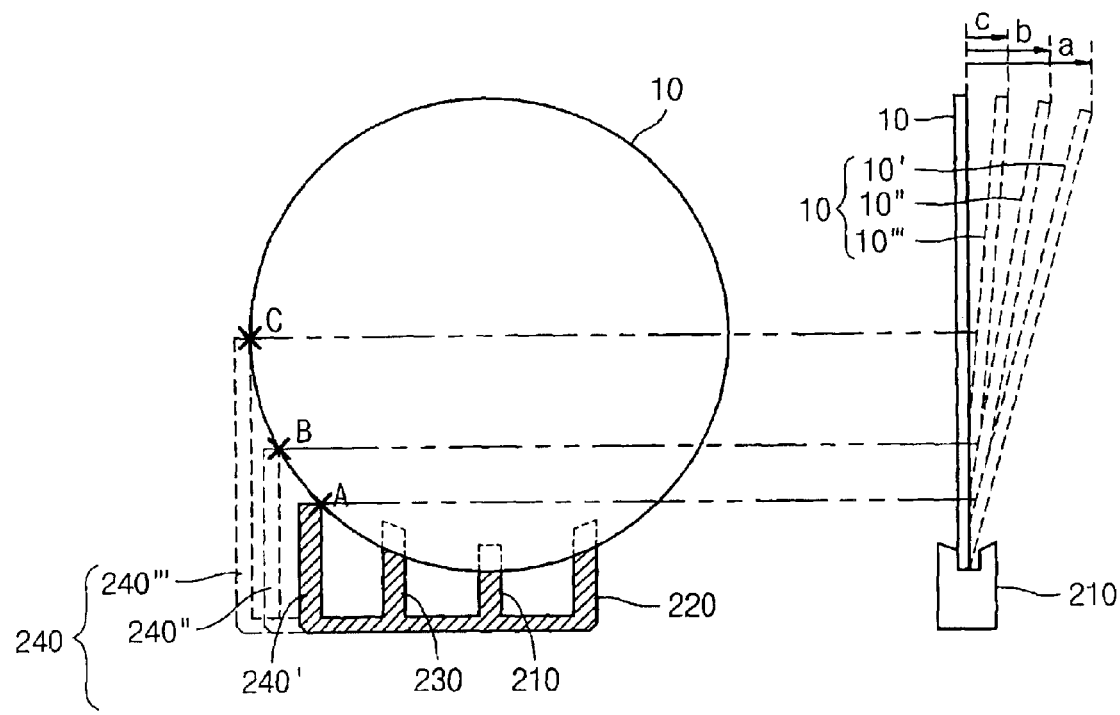
FIG. 9 is a diagram for explaining positions of a wafer edge which is in contact with a stopper member.

Referring to FIG. 9, the clearance in the groove of the first supporting member 210 is about 0.95 mm. The diameter of a wafer 10 inserted into the guide 200 is 300 mm. In FIG. 9, "A, B, and C" denote edges of a wafer 10 inserted into the stopper member 240, and "a, b, and c" denote horizontal distances between a wafer 10 located at various inclined positions 10', 10" and 10'".

Exemplary heights from a wafer bottom portion 11 to the edges A, B, and C are 54.6 mm, 82.6 mm, and 150 mm, respectively. Exemplary horizontal distances a, b, and c are 2.7 mm, 1.7 mm, and 0.2 mm, respectively.

There can be a situation when the spacing between respective wafers 10 is 5 mm based on half pitch. Then, when the edge A of the wafer 10 is in contact with the stopper member 240, adjacent wafers 10 can come in contact with each other. However, when the edges B and C of the wafer 10 are in contact with the stopper member 240, the wafer-contacting problem described above does not occur.

When an edge of a wafer 10 inserted into the stopper member 240 is the second wafer middle portion 13, the inclined distance of the wafer 10 is minimized. For this reason, this embodiment describes the case that the second wafer middle portion 13 is in contact with the stopper member 240. However, if the inclination and contacting of adjacent wafers 10 can be prevented due to the spacing between the wafers 10 and the clearance in the groove, the edge of the wafer 10 (i.e., a lower part of the second wafer middle portion 13) may come in contact with the stopper member 240.

Like the slots 222 formed at the second supporting member 220, each of the slots 240 formed at the stopper 240 has a substantially V-shaped configuration. The stopper member 240 and the third supporting member 230 are spaced apart from each other so that the DI water can smoothly flow therebetween.

The wafers 10 do not become moved to an undesirable substantially inclined position due to the use of the wafer guide 200 of the cleaning apparatus according to the present invention. The wafer guide 200 makes it possible to prevent contacting of the wafers 10 in a cleaning process and thereby avoid the problems associated therewith which have been described above.

The wafers 10 are loaded and/or unloaded, to and/or from the wafer guide 200 by a transfer robot 300. Since a first arm and a second arm of a typical transfer robot have the same length, and are in contact with the edge of a wafer at a sufficiently low position, the transfer robot only supports the wafer and does not push the wafer by force. Such a robot cannot load and/or unload the wafers 10 to and/or from the wafer guide 200. Therefore, the transfer robot 300 is different in construction than the typical transfer robot 300.

A transfer robot according to an embodiment of the invention is now described below with reference to FIG. 10. Particularly, a first arm of the transfer robot is illustrated in FIG. 11.

Figure 10:
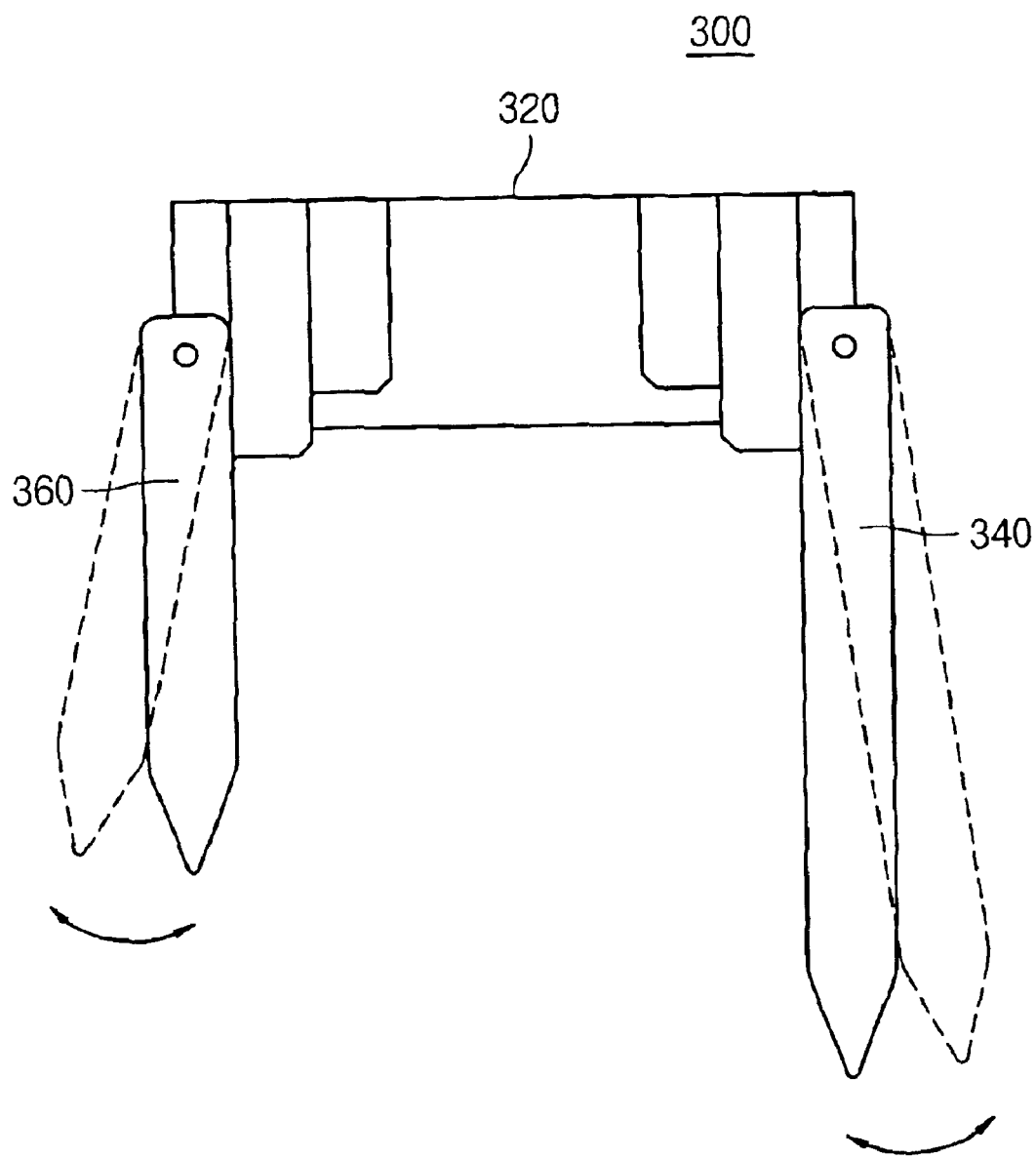
FIG. 10 is a cross-sectional view of a transfer robot according to the present invention.

Referring now to FIG. 10, a transfer robot 300 has a robot driving unit 320, a first arm 340, and a second arm 360. The first arm 340 supports the edge of the wafer that is positioned higher than the edge of the wafer 10 that is supported by the second supporting member 220 (see FIG. 12.) The second arm 360 supports wafers 10 by pushing an edge that is positioned higher than the edge of a wafer, which is in contact with the stopper member 240, with a predetermined force. The first and second arms 340 and 360 can be rotated within a predetermined range by the robot driving unit 320, as shown in FIG. 10, in order to hold the wafers 10.

Figure 11:
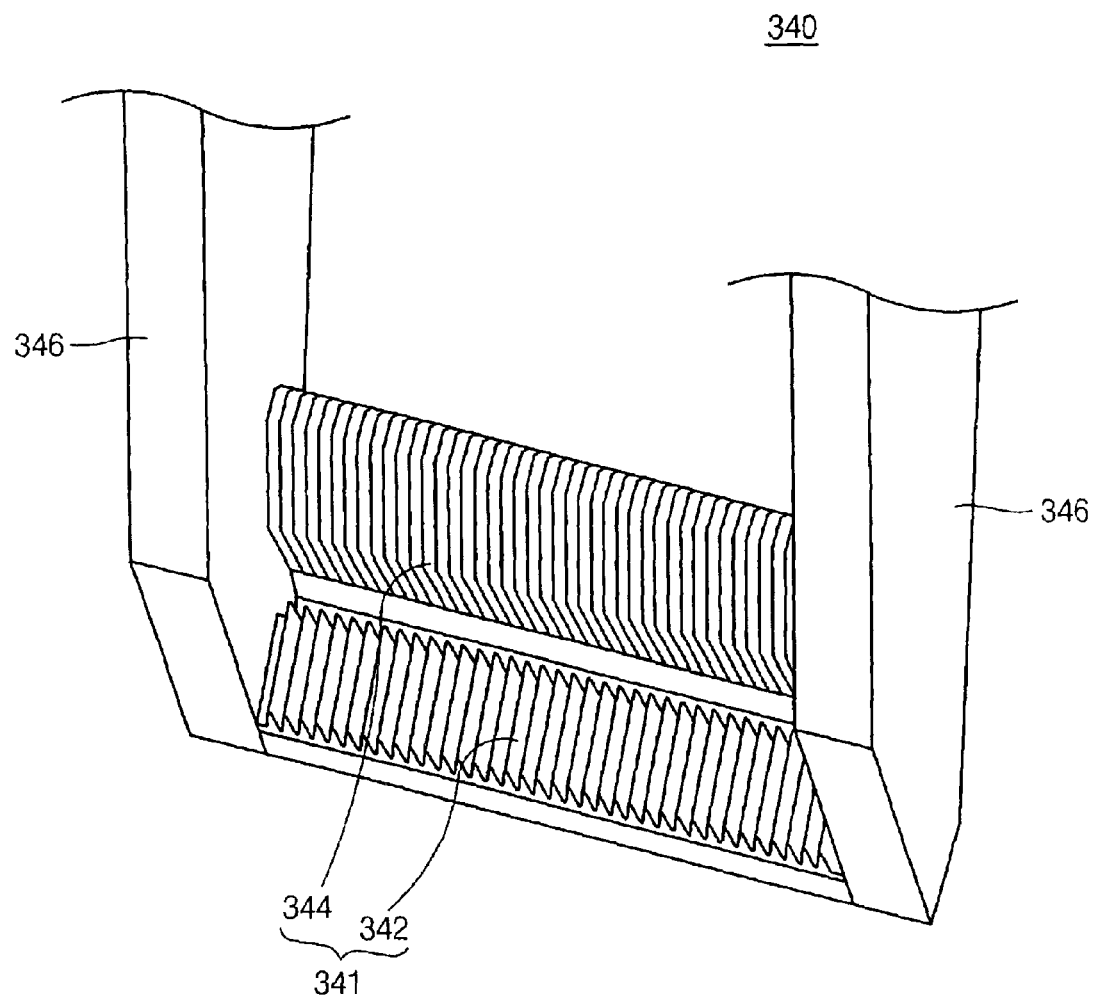
FIG. 11 is a perspective view of a first arm of the transfer robot shown in FIG. 10.

Referring to FIG. 11, the first arm 340 has a supporting portion 341 connected to first arm side portions 346. The first arm side portions 346 face each other and the supporting portion 341 is fixedly disposed therebetween.

The supporting portion 341 has lower slots 342 and upper slots 344 to support wafers 10. Thus, the wafer 10 is in contact with the supporting portion 341 at two points (i.e., the upper slot and the lower slot) in order to disperse a force transmitted to the wafers 10 from the hereinafter-described second arm 360.

As previously stated, unlike a typical wafer guide, the wafer guide 200 according to the present invention further includes stopper member 240. Accordingly, the second arm 360 cannot come in contact with the edge of a wafer 10 located at the same position as the edge of a wafer 10 supported by the first arm 340. The second arm 360 must be in contact with the edge of a wafer 10 at a higher position than the edge of a wafer 10 supported by the first arm 340. As a result, the second arm 360 is shorter than the first arm 340 (see FIGS. 10 and 12).

Figure 12:
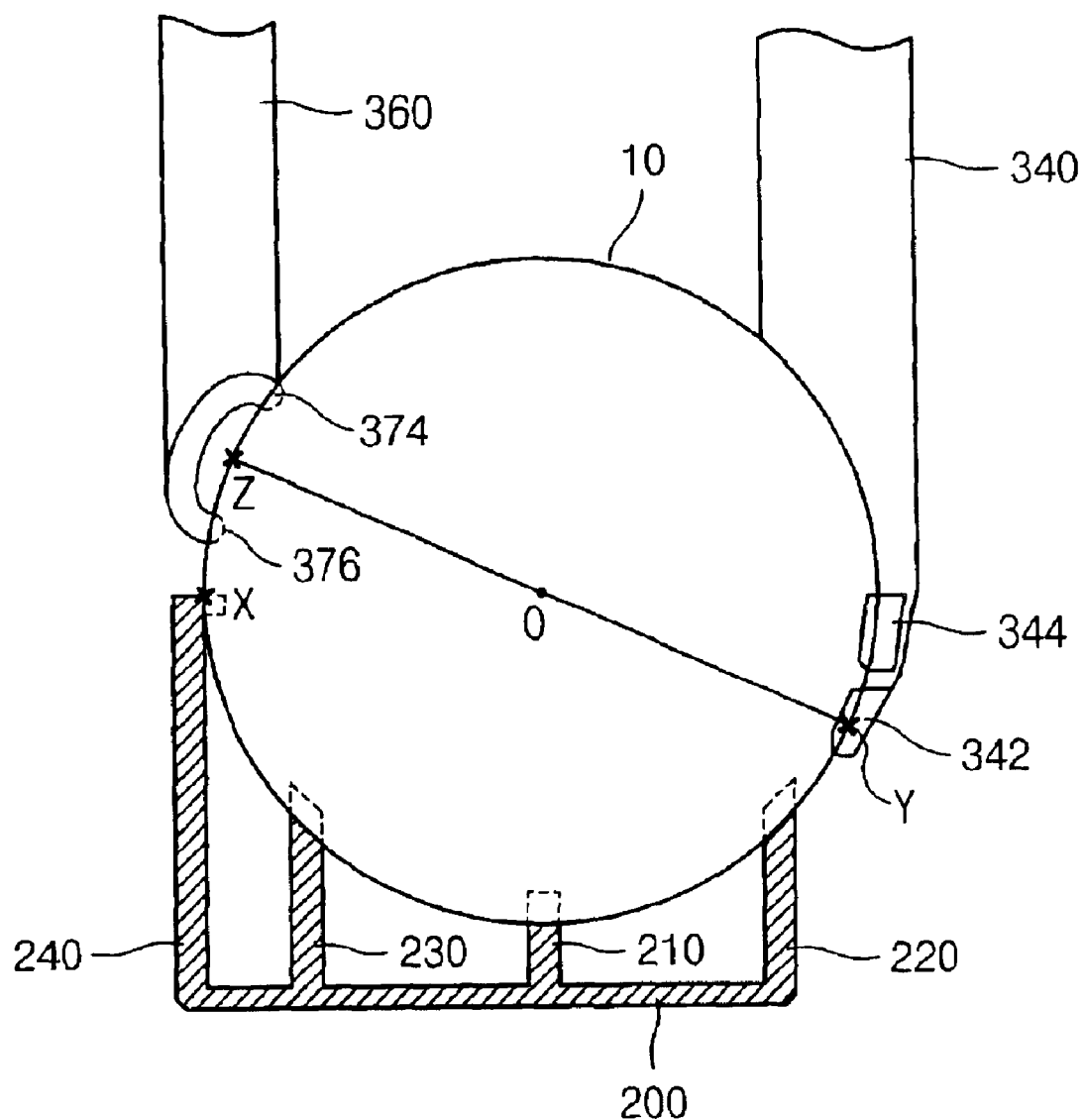
FIG. 12 is a diagram for explaining contact positions when a wafer edge comes in contact with the second arm of the transfer robot shown in FIG. 10.

FIG. 12 depicts the positions certain components of this invention when the edge of a wafer 10 is in contact with the second arm 360. Referring to FIG. 12, a contact point of the stopper member 240 and a wafer 10 is denoted as an "X" point, and a contact point of the lower slot 342 of the first arm 340 and the wafer 10 is denoted as a "Y" point. Further, the center of the wafer 10 is designated as an "0" point. The position of the wafer 10 that is symmetrical with the Y point, with respect to the 0 point, is defined as the "Z" point. To transfer and load and/or unload the wafers 10 in a stable manner, the second arm 360 must move against an edge of the wafer 10 between the X point and Z point. In this way, the length of the second arm 360 to facilitate the above-described operation is determined.

Figure 13:
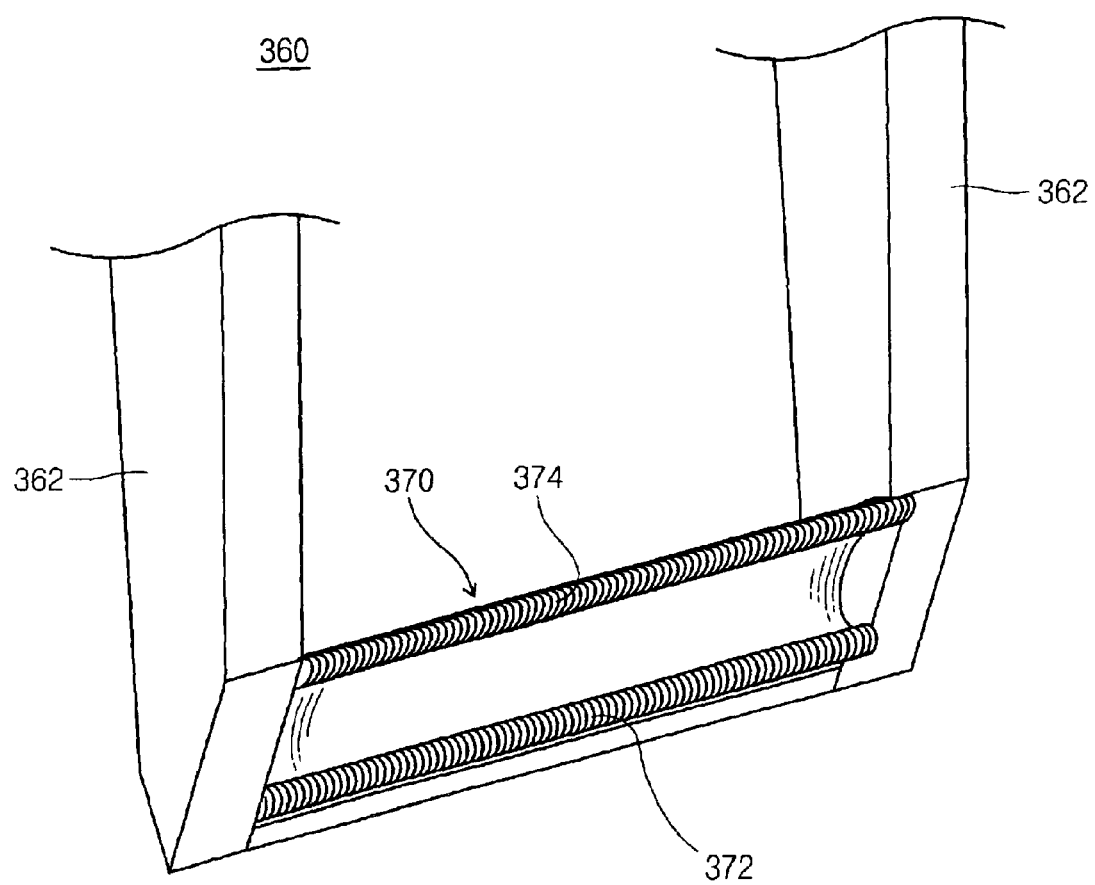
FIG. 13 is a perspective view of the second arm of the transfer robot shown in FIG. 10.
Figure 14:
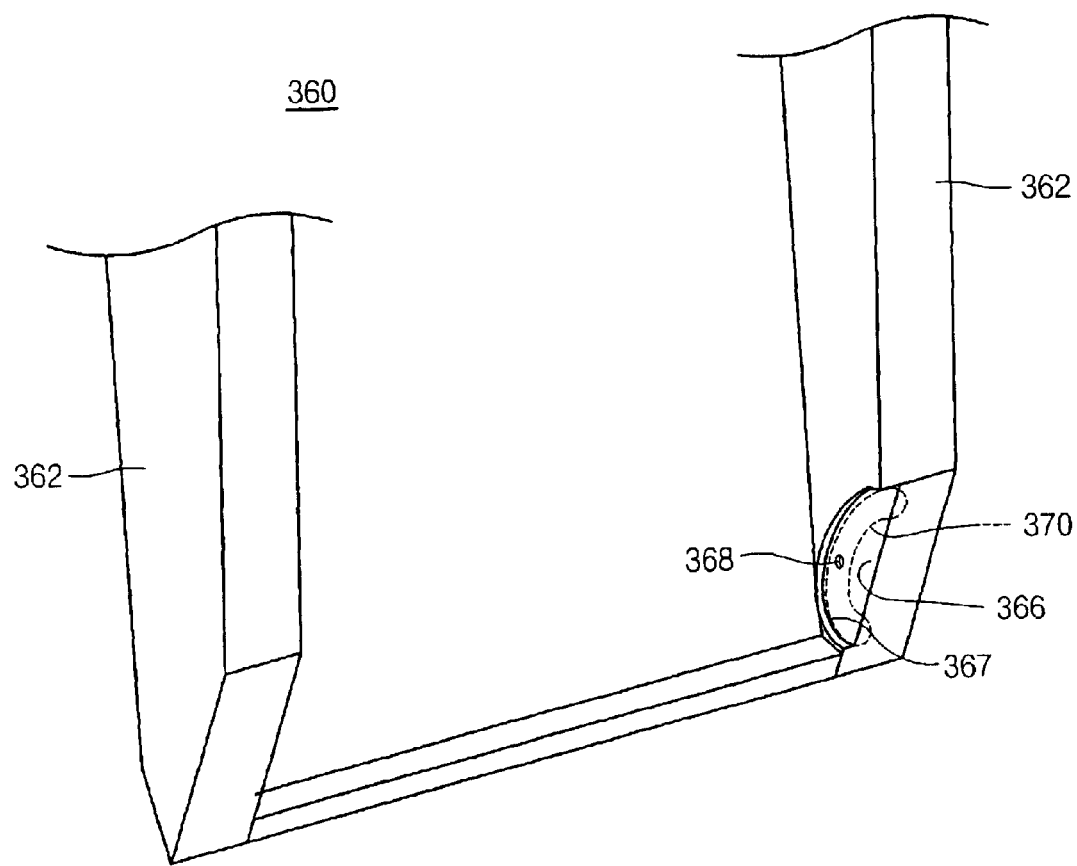
FIG. 14 is a perspective view showing a preferred embodiment of a lateral portion of the second arm shown in FIG. 13.
Figure 15:
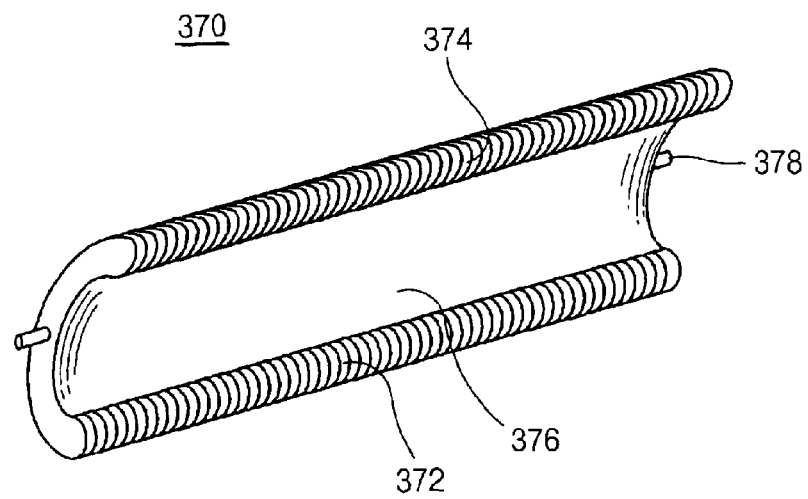
FIG. 15 is a perspective view showing a preferred embodiment of a member shown in FIG. 13.

Referring to FIG. 13 through FIG. 15, the second arm 360 has second arm side portions 362 connected to a load portion 370. The second arm portions 362 face each other, and the load portion 370 is connected therebetween.

Each of the second arm side portions 362 has a guide groove 366 at a side to which the load portion 370 is connected. The guide groove 366 is designed to direct the rotation of the load portion 370. The profile 367 of the guide groove 366 has a greater curvature radius than a later-described body portion of the load portion 370. A circular aperture 368 is formed in the guide groove 366. A rotatable pin 378 of the load portion 370 is inserted into the aperture 368.

The load portion 370 has a curved body portion 376 which includes a first contact edge 372, and a second contact edge 374. The first contact edge 372 is disposed at a lower part of the load portion 370 and has slots into which wafers 10 are respectively inserted. The second contact edge 374 is disposed at an upper part of the load portion 370 and has slots similar to the slots in the first contact edge 372. The first and second contact edges 372 and 374 are interconnected by the curved body portion 376.

The load portion 370 further has a rotatable pin 378 inserted into the aperture 368 of the second arm side portion 362. In order to relieve any stress applied to the wafer 10 when it is held by the second arm 360, the pin 378 enables the load portion 370 to be rotated within a predetermined range.

As previously stated, the transfer robot 300 includes the first and second arms 340 and 360 that are contact with edges at different heights. The transfer robot 300 is applicable to the wafer guide 200 having the stopper member 240.

Unlike the case where wafers are moved at one point, the second arm 360 comes in contact with wafers 10 at two points to move them. Accordingly, the force transmitted to the wafers 10 by the transfer robot is applied in a more overall manner. Further, when the load portion 370 is in contact with the wafers 10, it is rotated to relieve a stress applied to the wafers 10.

As explained so far, the present invention has the following advantages.

(1) A wafer guide has a stopper member to prevent adjacent wafers from being inclined and coming in contact with each other. Thus, it is possible to overcome the problems relating to poor drying such as water spots (or watermarks) produced when wafers are adhered in a drying process.

(2) A first arm and a second arm of a transfer robot supports the edges at different heights to facilitate load and/or unload of the wafers to and/or from a wafer guide having a stopper member in a stable manner.

(3) First and second arms of a present apparatus for manufacturing an integrated circuit device are in contact with a wafer at multiple points to spread out the force transmitted to the wafer.

(4) When the second arm is in contact with a wafer, the present apparatus for manufacturing an integrate circuit device is rotated within a predetermined range to relieve stresses applied to the wafer.

While the present invention has been described in terms of the particular embodiment, it will be understood that a person skilled in the art can adopt other forms, arrangement, composition, materials and the like without departing from the spirit of this invention, yet still fall within the scope of the invention as hereafter set forth in claims that follow.

What is claimed is:

1. An apparatus for manufacturing an integrated circuit device, comprising:
   a chamber for containing a fluid therein;
   a guide, seated in the chamber, on which a plurality of wafers having an outer circumferential edge are located, the guide including at least one supporting member for supporting the wafers and a stopper member for preventing the wafers supported by the supporting member from contacting adjacent wafers; and
   a transfer robot for loading and/or unloading the wafers to and/or from the guide, the transfer robot including:
   a first arm for supporting a first position of the edge of the wafer; and
   a second arm for supporting the edge of the wafer at a second position which is positioned higher than the first position of the first arm.

2. The apparatus as set forth in claim 1, wherein each supporting member and each stopper member has a plurality of slots, the outer circumferential edges of the wafers being inserted into the slots.

3. The apparatus as set forth in claim 2, wherein the stopper member is in contact with a portion of the outer circumferential edge at a higher position than a portion of the outer circumferential edge that is contacted by the supporting member.

4. The apparatus as set forth in claim 2, wherein the slots of each supporting member have either a substantially Y-shaped configuration or a substantially V-shaped configuration, and wherein the stopper member has a substantially V-shaped wafer configuration.

5. The apparatus as set forth in claim 1, wherein the guide comprises:
   a first supporting member for supporting the wafers at a first point; and
   a second supporting member for supporting the wafers at a second point which is lower than the first point.

6. The apparatus as set forth in claim 5, wherein the guide further has a third supporting member; and wherein the third supporting member and the second supporting member are substantially symmetrical with respect to the first supporting member.

7. The apparatus as set forth in claim 1,
   a first arm for supporting a first portion of the edge of the wafer; and
   a second arm for supporting a second portion of the edge of the wafer, the second arm being shorter than the first arm.

8. The apparatus as set forth in claim 1, wherein the first arm includes a plurality of slots into which the wafers can be inserted.

9. The apparatus as set forth in claim 1, wherein the second arm includes a load portion for engaging and moving the wafers.

10. The apparatus set forth in claim 9, wherein the load portion engages the wafer at a contact edge between wherein the edge is in contact with the stopper member and wherein the edge is in contact with the first arm.

11. The apparatus as set forth in claim 9, wherein the load portion further has a plurality of contact edges for dispersing a force transmitted to the wafer by the second arm.

12. The apparatus as set forth in claim 9, wherein the load portion has first and second contact edges, and a body portion which interconnects the first and second contact edges, said load portion being rotatable within the range of a predetermined angles.

13. The apparatus as set forth in claim 1, wherein the second arm further has guide grooves for guiding the rotation of the load portion.

14. The apparatus as set forth in claim 13, wherein the guide groove has an aperture defined therein, and the load portion further includes a rotation member rotatably inserted into the aperture.

15. The apparatus as set forth in claim 1, wherein the chamber is employed for cleaning the wafers.

16. An apparatus for manufacturing an integrated circuit device, comprising:
   a chamber;
   a guide, seated in the chamber, on which a plurality of wafers having outer circumferential edges are located, the guide including at least one supporting member having a plurality of slots into which the wafers are inserted, and a stopper member into which an edge of the respective wafers is inserted for preventing the wafers inserted into the slots from contacting adjacent wafers; and
   a transfer robot for loading and/or unloading the wafers to and/or from the guide.

17. The apparatus as set forth in claim 16, wherein the transfer robot includes:
   a first arm for supporting an edge of the wafers at a higher point than the edge of the wafers that are in contact with the supporting member; and
   a second arm for applying a force to an edge of a wafer at a higher point than the edge of the wafer in contact with the stopper member.

18. An apparatus for manufacturing an integrated circuit device, comprising:
   a chamber for containing a fluid therein;
   a guide seated in the chamber for supporting a plurality of wafers, the guide including a first supporting member including slots having a Y-shaped configuration into which the wafers are inserted;

a second supporting member including slots having a V-shaped configuration into which the wafers are inserted;

a stopper member including slots having a V-shaped configuration in contact with the wafer, the point of contact of the wafers with the stopper member being at a higher point than the point at which the wafers are supported by the second supporting member; and a transfer robot for loading and/or unloading the wafers to and/or from the guide.

19. The apparatus as set forth in claim 18, wherein the transfer robot includes:

a first arm for supporting a first position of the edge of the wafer; and a second arm for supporting the edge of the wafer at a second position higher than the first position of the first arm.

* * * * *